US 6,239,477 B1

(12) United States Patent
Johnson

(10) Patent No.: US 6,239,477 B1
(45) Date of Patent: May 29, 2001

(54) SELF-ALIGNED TRANSISTOR CONTACT FOR EPITAXIAL LAYERS

(75) Inventor: F. Scott Johnson, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/167,855

(22) Filed: Oct. 7, 1998

(51) Int. Cl.[7] ............... H01L 27/082; H01L 27/102
(52) U.S. Cl. ............................... 257/592; 257/593
(58) Field of Search .................. 257/565, 592, 257/593

(56) References Cited

U.S. PATENT DOCUMENTS

| | | | |
|---|---|---|---|
| 4,851,362 | * | 7/1989 | Suzuki ........................... 257/592 |
| 5,593,905 | * | 1/1997 | Johnson et al. ................ 257/592 |

OTHER PUBLICATIONS

Article from IEEE Electron Device Letters, vol. 19, No. 5, May 1998, "Effects of Buried Layer Geometry on Characteristics of Double Polysilicon Bipolar Transistors", pp. 160–162 (Kenneth K.O, Member IEEE and Brad W. Scharf, Member IEEE).

* cited by examiner

Primary Examiner—Steven Loke
(74) Attorney, Agent, or Firm—Wade James Brady, III; Frederick J. Telecky, Jr.

(57) ABSTRACT

An emitter contact structure, and associated method, for a bipolar junction transistor. The emitter contact structure includes a collector region, an intrinsic base region within the collector region, an extrinsic base region within the collector region, a base link-up region within the collector region between the intrinsic base region and the extrinsic base region, a base link diffusion source layer above the base link-up region, a capping layer above the base link diffusion source layer, and a base electrode laterally engaging the extrinsic base region.

4 Claims, 3 Drawing Sheets

SELF-ALIGNED TRANSISTOR CONTACT FOR EPITAXIAL LAYERS

FIELD OF THE INVENTION

This invention relates to semiconductor devices and related processing, and more particularly to the formation of self-aligned contact structures for bipolar junction transistors, and the process for making the same.

BACKGROUND OF THE INVENTION

The use of an epitaxial base in a BJT can provide the advantage of increased control over base doping concentrations, which results in narrower bases with reduced transit times and lower peripheral base dopant concentrations for reduced base-emitter capacitances ($C_{je}$). These characteristics generally enhance the performance of the resulting device. However, epitaxial bases are difficult to integrate into double polysilicon self-aligned (DPSA) BJT's. If the epitaxial base is deposited prior to the base polysilicon, then the epitaxial base can be damaged or removed by the base polysilicon etch. Alternatively, deposition of the epitaxial base after the emitter region etch requires selective epitaxy processing. Even with selective epitaxy processing, side-wall depositions on the base polysilicon can affect the final emitter region sizing.

One remedy for this issue is to deposit the epitaxial layer and pattern a silicon dioxide ($SiO_2$) etch stop prior to the base polysilicon deposition. The emitter opening can then be formed without damaging the underlying epitaxial layer. The structure resulting from this double polysilicon non self-aligned (DPNSA) process is illustrated in FIG. 1.

In this known structure, the base diffusion (originating from the polysilicon-epitaxy interface) is needed to reduce the higher resistance base epitaxy region in order to achieve a low resistance base layer for desired contact performance. This base diffusion cannot not overlap the emitter diffusion (originating from the emitter polysilicon-base epitaxy interface) without significantly increasing Cje, reducing base-emitter breakdown (BVebo) and negatively impacting reliability. Since the extrinsic base diffusion process is separated from the base contact by the size of the overlap of the etch-stop region over the emitter region, and since this overlap is affected by lithographic sizing variations as well as alignment errors, the drawn overlap must be equal to the total of the widths due to the base diffusion, emitter diffusion, sizing variation, and maximum alignment error. For this reason, the base link-up resistance and the total device area will be larger than achieved in a standard DPSA structure.

A DPNSA BJT is shown in FIG. 1, and a dual poly self-aligned (DPSA) BJT is shown in FIG. 2. In the DPNSA BJT of FIG. 1, the distance between the inside edge 20 (outside edge of the emitter window) of the base-emitter spacer 22 to the edge 24 of the isolation structure 26 is designed to include the base link-up diffusion width (or spacer width) "A," the emitter to etch stop alignment "B," the pad to field alignment "C," and the minimum width for extrinsic base diffusion (or extrinsic base junction depth) "D." Each of these dimensions is approximately 0.1 microns, requiring the edge of the emitter window to be positioned at a minimum of 0.4 microns away from the border 24 of the isolation structure 26 to allow for maximum deviation in processing.

In the DPSA BJT shown in FIG. 2, the minimum spacing between the inside edge 28 of the spacer 30 (outside edge of the emitter window) is spaced from the edge 32 of isolation structure 34 by the base link-up diffusion width (spacer width) "A," the emitter to field alignment "E," and the minimum width for extrinsic base diffusion (or extrinsic base junction depth) "D." As each of these dimensions is approximately 0.1 microns, the placement of the edge of the emitter window is designed to allow 0.3 microns variance between its placement and the isolation structure to allow for deviation in the processing.

It is with the foregoing problems in mind that the instant invention was developed.

SUMMARY OF THE INVENTION

The present invention concerns an emitter contact structure for, and associated method for making, a bipolar junction transistor. The emitter contact structure includes a collector region, an intrinsic base region within the collector region, an extrinsic base region within the collector region, a base link-up region within the collector region between the intrinsic base region and the extrinsic base region, a base link diffusion source layer above the base linkup region, a capping layer above the base link diffusion source layer, and a base electrode laterally engaging the extrinsic base region.

In an additional embodiment, the intrinsic, extrinsic and link-up base regions are at a position above the top surface of opposing isolation structures. In a further embodiment, the base electrode is integrally formed with the same layer in which the intrinsic, extrinsic and link-up base regions are formed, and has a laterally disposed, substantially vertically oriented interface with the extrinsic base region.

The inventive method for fabricating the bipolar transistor of the present invention includes the steps of forming opposing isolation structures, and forming a lower collector region positioned between the isolation structures. Then, a silicon layer is integrally deposited over the collector region and the isolation structures to integrally form a polysilicon base electrode over the isolation structures, and an epitaxial silicon region over the lower collector region. The base electrode and the epitaxial silicon have a laterally oriented, substantially vertically disposed junction. The epitaxial silicon region has a bottom layer forming an upper collector, a middle layer forming an intrinsic base region, and an upper layer forming an emitter region. Further, a doped base link diffusion layer is positioned above the base electrode and epitaxial silicon region and the base electrode, and a capping layer is positioned above the base link diffusion source layer. An extrinsic base region is diffused within the epitaxial silicon through the base electrode from the doped base link diffusion source layer, and a base link-up region is formed within the epitaxial silicon region from the base link diffusion source layer to connect the intrinsic base region and the extrinsic base region.

A primary object of the present invention is to provide a bipolar transistor structure that allows a more densely packed design.

Another object of the present invention is to integrally form the base electrode with the region containing the extrinsic, intrinsic, and link-up base regions.

The foregoing and other features, utilities and advantages of the invention will be apparent from the following more particular description of a preferred embodiment of the invention as illustrated in the accompanying drawings.

DETAILED DESCRIPTION OF THE PREFERRED EMBODIMENT

Figure 3:
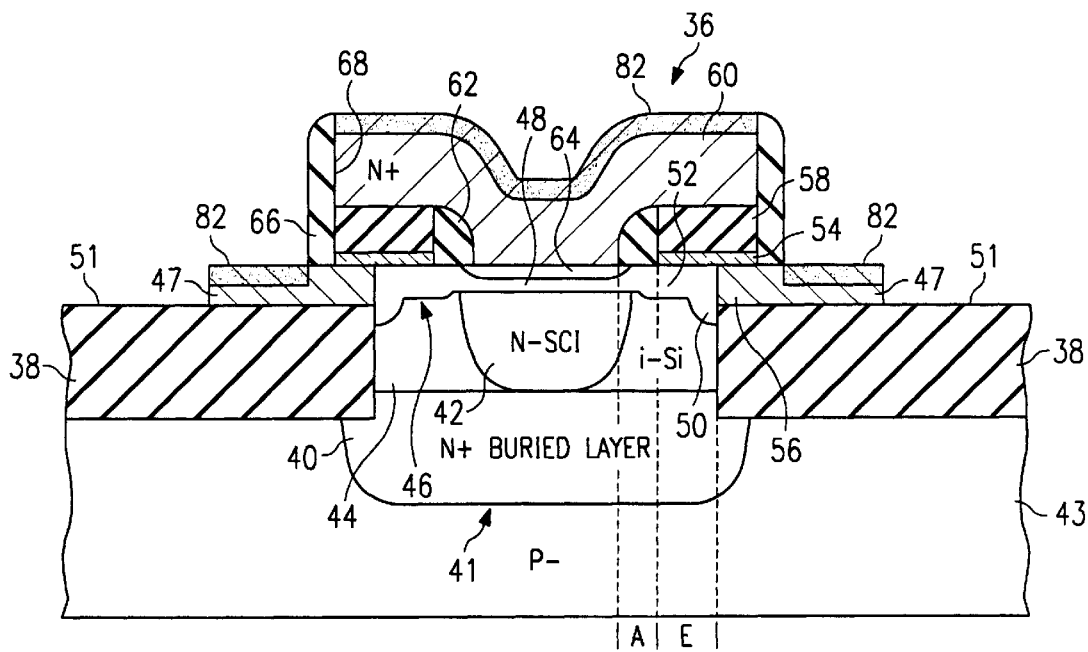
FIG. 3 is a cross-sectional diagram of the BJT of the present invention.

The invention is described in conjunction with a double polysilicon bipolar transistor (BJT) formed using a BiCMOS process. It will be apparent to those skilled in the art that the invention is also applicable to other BiCMOS processes and devices as well as to bipolar processes and devices. A BJT 36 according to the invention is shown in FIG. 3. Field isolating regions isolate the BJT from other devices (not shown) such as other BJT's, MOS transistors, diodes and resistors, etc. The field isolating regions can be formed by trench isolation, or by standard LOCOS processes, as are known in the art. A buried layer 40 extending between the opposing isolation regions is formed in the collector region 41 of the substrate 43 and acts as a collector, as is well-known in the art. A self-aligned collector implant region 42 extends from the buried layer upwardly through the intrinsic silicon 44 to contact the base region 46. The self-aligned collector implant 42 is surrounded by intrinsic silicon 44, which reduces the capacitance of the base link-up region. The buried layer 40 is preferably doped at a level of 5E19 to 1E20 atoms per cubic centimeter, and the self-aligned collector implant 42 is preferably doped at a level of 1E17 atoms per cubic centimeter.

The base region 46 consists of an intrinsic base region 48, an extrinsic base region 50, and a base link-up region 52. The intrinsic base region 48 forms a junction with the self-aligned collector implant region 42. The extrinsic base region 50 provides an area for connection to the base region 46 by a base electrode 47 for electrical connection to the base contact (not shown). The base link-up region 52 provides a low resistance connection between the extrinsic and intrinsic base regions. The intrinsic 48, extrinsic 50 and base link-up 52 regions all have the same conductivity type. For example, if the collector region 41 is N-type, the base regions are P-type. Alternatively, if the collector region is P-type, the base regions are N-type.

The intrinsic base region, extrinsic base region, and link-up base region are each at a position substantially above the top surface 51 of the isolation structure, and laterally disposed from the base electrode 47.

The base electrode comprises a layer of doped polysilicon and is connected to the extrinsic base region 50 through a laterally disposed, vertically oriented junction. The base electrode 47 is the dopant source, along with the base link-up dopant source layer 54, for forming the extrinsic base region 50. Thus, for an NPN BJT, the base electrode 47 is doped P-type. Alternatively, for a PNP BJT, the base electrode 47 is doped N-type. The doping of the base electrode 47 is adjusted to provide the desired conductivity for the base electrode. The base electrode is formed integrally with the undoped intrinsic silicon over the collector region 41, as is described below. The extrinsic base region 50 is doped from the laterally disposed base electrode 47.

A base link diffusion source layer 54, such as BSG, is positioned above the interior end 56 of the base electrode 47 and extends over the extrinsic 50 and link-up 52 base regions. The diffusion source layer 54 is a dopant source for the base link-up region 52, and through the base electrode 47 for the extrinsic base region. The diffusion source layer comprises a material that is capable of acting as a dopant source for N-type and/or P-type dopants and may be selectively etched with respect to silicon and is compatible with conventional semiconductor processing. Examples include silicate glass such as borosilicate glass (BSG) and phosphosilicate glass (PSG) as well as silicon-germanium (SiGe).

A barrier layer 58 is deposited on an upper surface of the base link diffusion source layer 54. The barrier layer 58 is a capping or dielectric layer, such as silicon nitride ($Si_3N_4$) or TEOS. This barrier layer forms an interpolysilicon dielectric between the base polysilicon forming the base electrode 47 and the emitter polysilicon 60.

Base emitter spacers 62 cover the outer edge of the emitter region and the inner edge of the intrinsic base region, and the combination of the base emitter spacers and the capping or dielectric layer isolate the emitter electrode 60 and the base electrode 47. The emitter electrode 60 preferably comprises a second layer of doped polysilicon, and is the dopant source for the emitter region 64. The emitter electrode 60 has the opposite conductivity of the base electrode 47.

The stacked layer of the second polysilicon 60, the interpolysilicondielectric, and the base link diffusion source layer 54, are patterned and etched to the surface of the first polysilicon (base electrode) layer 47. Spacers 66 are formed on the outer sidewall 68 to improve the topographical transition for subsequent layers, and they act to isolate the silicide formation on the exposed emitter 60 and base 47 electrode surfaces.

The intrinsic base region 48 is doped during the epitaxial silicon deposition, as described below, and is not implanted as with previous processes. The intrinsic base region 48 is connected to the base contact (not shown) by the base electrode 47 through the formation of the link-up base region 52 formed by the base link diffusion source layer 54, and by the lateral diffusion of the base electrode 47 to form the extrinsic base region 50.

Figure 4:
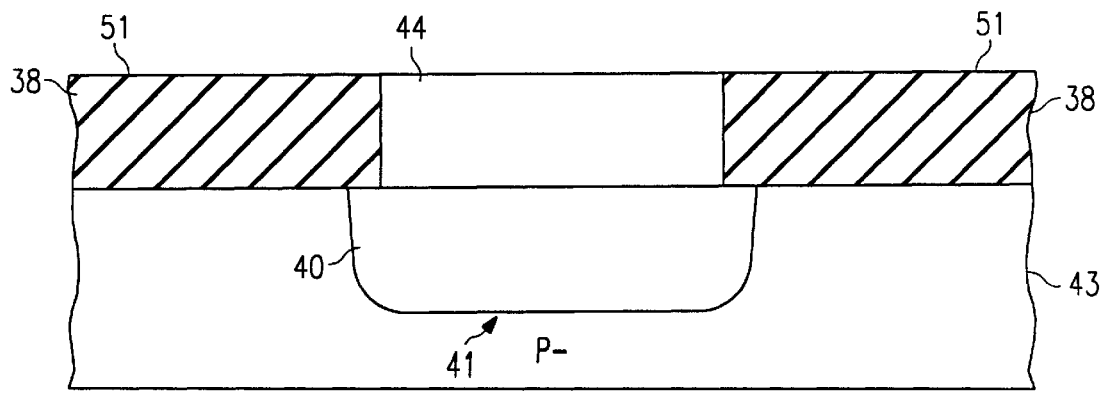
FIGS. 4–7 are cross-sectional diagrams of the BJT of FIG. 3 at various stages of fabrication.
Figure 5:
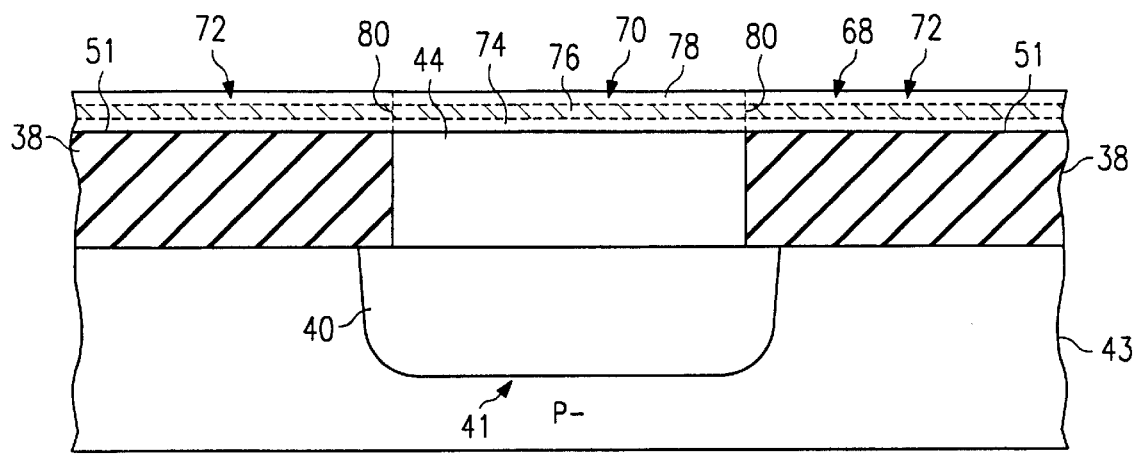

Referring the FIGS. 4–7, the emitter stack structure as previously described is shown at various stages of fabrication. FIG. 5 illustrates a semiconductor body after the formation of the collector region 41 and the trench isolation regions 38. An N+ buried layer 40 was formed as a subcollector in the substrate previously, and the trench isolation regions 38 were formed such that the subcollector extends between the opposing isolation regions. Intrinsic silicon 44 is positioned above the subcollector 40 and between the opposing isolation regions 38. The intrinsic silicon 44 positioned between the opposing isolation regions in conjunction with the buried layer 40 form generally the collector region 41, in which is formed the BJT. The collector region 41 is formed through a split collector epitaxy. Epitaxial silicon is first deposited to form the lower collector region prior to the field or trench isolation. The second or upper portion of the collector is then formed during the deposition of the first or base polysilicon layer, as is described below.

After the trench isolation, the top surface of the device as shown in FIG. 4 includes opposing regions of the trench isolation 38 each having a top surface 51, such as silicon oxide, with the interpositioned intrinsic epitaxially deposited silicon 44. The base polysilicon/epitaxial silicon layer 68 is then deposited in three phases, which forms epitaxial silicon deposition 70 over the exposed intrinsic silicon 44, while forming polysilicon 72 over the silicon dioxide in the trench isolation regions 38.

The polysilicon/epitaxial silicon deposition process is broken into three separate steps wherein the first layer 74 is undoped. This first layer forms the second or upper part of the split collector epitaxy, and is deposited to a thickness of approximately 700 Å. This upper portion of the collector region is at a position above the top surface 51 of the isolation structures.

The second phase of the polysilicon/epitaxial silicon deposition step includes depositing a boron-doped layer 76. The layer 76 is in situ doped with 5E18 and 1E19 atoms per cubic centimeter, and deposited to a thickness of approximately 500 Å. The third phase of the polysilicon/epitaxial silicon deposition step deposits an undoped top layer 78 to a thickness of approximately 200 to 300 Å. The entire thickness of this layer is approximately 1500 Å. This polysilicon/epitaxial silicon deposition process is a nonselective epitaxial process forming polysilicon over the silicon dioxide trench isolation regions 38, and epitaxial silicon over the intrinsic silicon collector region 44. The process is substantially continuous during the formation of the three layers, with the boron doping source being activated during the deposition of the second layer 76 to effect an in situ doping process.

The middle layer 76 forms the intrinsic base portion 48. This layer should be approximately 500 Å to maintain high frequency performance characteristics. The polysilicon formed over the field region must be thick enough to act as a combination lateral base diffusion source, low resistance base conductor, and provide sacrificial material for silicide formation for base contact purposes (not shown). Thus, the overall thickness of the material deposited in this three stage process should be approximately 1400 to 1500 Å.

The polysilicon deposited during the polysilicon/epitaxial silicon deposition over the trench isolation, or field, regions 38 has an abrupt doping profile with no doping in the top or bottom of the polysilicon layer, and relatively high doping in the middle 500 Å. This abrupt doping profile is a result of the middle layer being doped during deposition which formed the intrinsic base region 48 over the collector region 41. While three layers are shown in the FIG. 3, the actual film layer is homogenous in vertical profile except for the higher boron doping in the middle layer 76 which occurred in situ during deposition. The temperature during the polysilicon/epitaxial silicon deposition step must be low enough to not diffuse the boron from the middle layer 76. Preferably, a temperature of 800 C or less is used.

The interface lines 80 shown in FIG. 3 represent a demarcation between the polysilicon formed over the field and the epitaxial silicon formed over the intrinsic silicon 44 of the collector region 41. The epitaxial silicon formed over the intrinsic silicon 44 forms a laterally disposed, substantially vertically oriented junction interface with the base electrode 47. Lateral diffusion from the base electrode 47 (with some of the dopant coming from the base link-up dopant source layer 54 into and through the base electrode) into the epitaxial silicon 70 forms the extrinsic base doped region 50, and occurs through the substantially vertically oriented interface 80 in a substantially lateral direction.

Figure 6:
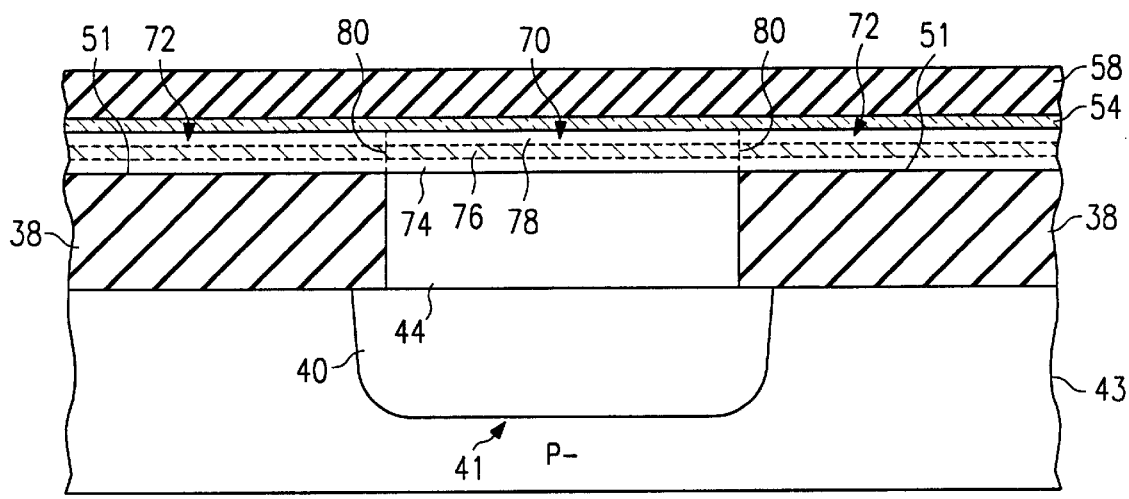

As seen in FIG. 6, a base link diffusion source layer 54 is then deposited on the base polysilicon 72/epitaxial silicon 70 layer, and is formed to a thickness of approximately 500 to 1000 Å. As discussed above, the base link diffusion source layer 54 comprises a material that may be etched selectively with respect to silicon and that may function as a dopant source for a base link-up region to be formed later in the process. The base link diffusion source layer 54 is preferably doped in situ, or implant doped after deposition. The doping concentration of the base link diffusion source layer 54 is determined by the desired resistance of the base link-up region 52 to be subsequently formed. Ideally, dopant is provided to the first polysilicon layer surface from the source layer 54 that is equal to or greater than the solid solubility of boron in silicon at the temperature of the rapid thermal anneal used to form the emitter region. Preferably, the dopant in the source layer 54 provides the dopant to the surface of the first polysilicon at higher than the solid solubility level. The emitter anneal forms the emitter region, the base link and extrinsic base regions, and the associated junctions. For instance, if the source layer 54 were BSG glass, the dopant level would be 5% boron in the BSG glass.

A capping layer 58 is then deposited on the base link diffusion source layer 54 as a. barrier to up diffusion of the dopant from the base link diffusion source layer 54, and to form an inter-polysilicondielectric between the base polysilicon 47 and the emitter polysilicon 60 to be subsequently deposited. The capping layer can be TEOS, silicon nitride, or any other dielectric material, and is approximately 2000 Å thick. The base link diffusion source layer 54 and the capping layer 58 are then patterned and etched to form the emitter window. The etch process is highly selective against silicon so as to not damage the silicon exposed during the etch process. The base-emitter 62 spacer is formed to provide a controlled and repeatable link-up distance for the base diffusion that is independent from the lithography variations. The spacer can be made of silicon nitride ($Si_3N_4$) and can be formed with the standard deposition and isotropic etch back process.

Figure 7:
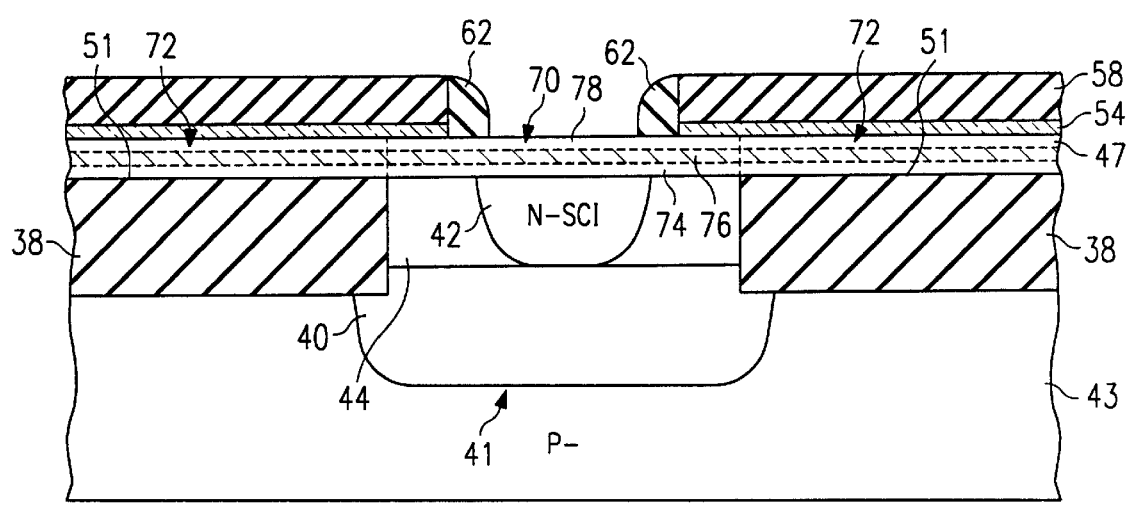

A blanket phosphorous implant is then performed to form the self-aligned collector implant 42 in the collector region 41. The self-aligned collector implant 42 is doped to a level of approximately 1E17 atoms per cubic centimeter, and is surrounded by the intrinsic silicon 44, which combination reduces the capacitance of the link-up base region 52. The structure of the BJT as this point is shown in FIG. 7.

A second layer 60 of doped polysilicon is then deposited on top of the capping layer 58 and into the emitter opening. The second layer of polysilicon is on the order of 2000 Å. The second polysilicon layer may be doped In situ or implant doped after deposition. An emitter anneal is then performed which simultaneously diffuses the dopant from the emitter polysilicon 60 to form the emitter region in the top layer of the epitaxial silicon 70 and simultaneously diffuses the base link-up region 52 to connect the intrinsic base region 48 with the extrinsic base region 50. The dopant for the base link-up region 52 is provided by the base link diffusion source layer 54. The emitter polysilicon 60 is then patterned and etched to etch the emitter polysilicon 60, base link diffusion source layer 54, and the capping layer 58 to stop on the first layer of polysilicon 47. Spacers 66 are then formed on the sidewalls 68 of the emitter polysilicon 60, capping layer 58 and base link diffusion source layer 54 to improve the topographical features for subsequent layers, as well as provide a minimum spacing between the adjacent features. The spacers are made of silicon nitride or silicon dioxide, and are formed by any known process, such as the conformal deposition and isotropic etch-back process. Silicide 82 is then formed on the exposed surfaces of the base 47 and emitter 60 polysilicon layers, and is separated between the two polysilicon layer surfaces by the spacers 66. The silicide improves the base contact resistance characteristics. The completed structure is shown in FIG. 3.

Standard processing techniques can be used to continue fabrication of this structure into a complete functioning BiCMOS device.

Since the base diffusion is self-aligned in the three step polysilicon/epitaxial silicon deposition, and is independent of the diffusion source patterning, no alignment tolerances of the base link region 52 to the emitter region 64 need to be accounted for in sizing the extrinsic device area. This reduces the size of link-up region 52 from prior art structures. The relatively thick first layer of polysilicon 47 formed during the split collector epitaxy step provides both a lateral diffusion path for the boron to form the extrinsic base region 50, and a low resistive base contact, the overlap of the emitter polysilicon 60 over the field and the corresponding sizing of the diffusion source pattern does not affect the size of the extrinsic device areas. The only determining factor for alignment is that the base diffusion source (base polysilicon 47) must be spaced a distance away from the emitter at least a distance equal to the spacer width. Therefore, the total size of the device is equal to the emitter width, the spacer widths, and the alignment tolerance of the emitter etch to the field oxide. This is a reduction from the extrinsic base sizing of the standard DPSA structure in which a minimum area for vertical base contact must be provided.

Figure 1:
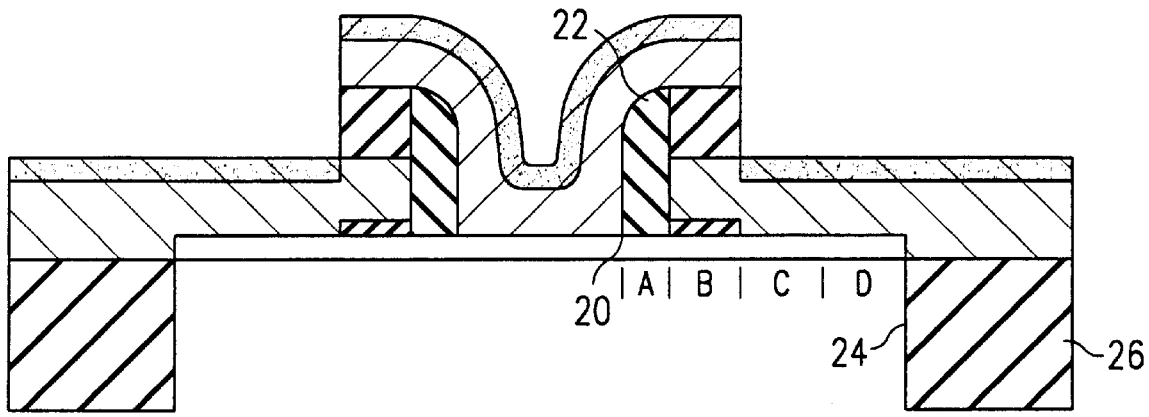
FIG. 1 is a cross-sectional diagram of a prior art DPNSA BJT.
Figure 2:
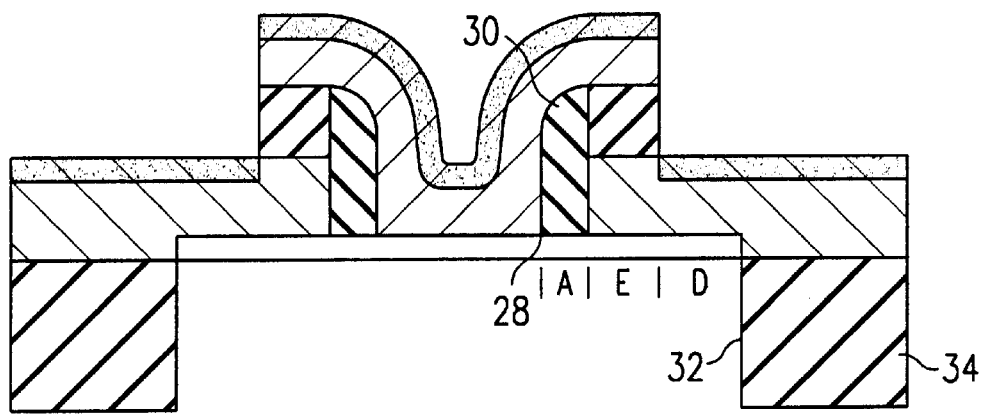
FIG. 2 is a cross-sectional diagram of a prior art DPSA BJT.

As shown in FIG. 3, the edge of the emitter window can be spaced with much less tolerance with respect to the isolation structure 38 due to the self-aligned base diffusion in the structure and process of the present invention. The outer edge of the emitter window can be designed to be positioned a distance away from the isolation structure 38 defined by the base link-up diffusion width (spacer width) "A," and the emitter to field alignment width "E." Since each of these dimensions is approximately 0.1 microns, this alignment dimension variation is approximately only 0.2 microns total. This allows structures to be packed more densely in a given surface area than a standard DPNSA and DPSA structures, as shown in FIGS. 1 and 2, without any detrimental effect on the performance characteristics of the BJT. In addition, the extrinsic base to collector capacitance and the collector to substrate capacitance is reduced, and this results in increasing the speed at which the transistor and associated circuit perform.

In the fabrication of the inventive structure, known or available processing steps, such as deposition, doping and etching techniques and parameters, can be used for the several of the individual steps.

While the invention has been particularly shown and described with reference to a preferred embodiment thereof, it will be understood by those skilled in the art that various other changes in the form and details may be made without departing from the spirit and scope of the invention.

A presently preferred embodiment of the present invention and many of its improvements have been described with a degree of particularity. It should be understood that this description has been made by way of example, and that the invention is defined by the scope of the following claims.

What is claimed is:

1. A bipolar transistor comprising:
a collector region;
an intrinsic base region over said collector region;
an extrinsic base region over said collector region;
a base link-up layer region over said collector region between said intrinsic base region and said extrinsic base region;
a base electrode laterally engaging said extrinsic base region; and
a base link diffusion source layer above said base link-up region and said base electrode.

2. A bipolar transistor comprising:
a collector region;
an intrinsic base region over said collector region;
an extrinsic base region over said collector region;
a base link-up layer region over said collector region between said intrinsic base region and said extrinsic base region;
a base electrode laterally engaging said extrinsic base region;
a base link diffusion source layer above said base link-up region and said base electrode;
a capping layer above said base link diffusion source layer.

3. A bipolar transistor comprising:
a collector region positioned between opposing barrier structures, each having a top surface;
a base region over said collector region and at a position substantially above said top surfaces of said barrier structures, said base region including an intrinsic base region, an extrinsic base region, and a base link-up region between said intrinsic base region and said extrinsic base region;
a base electrode formed integrally with and laterally engaging said extrinsic base region;
a base link diffusion source layer above said base link-up region and said base electrode; and
a capping layer above said base link diffusion source layer.

4. The bipolar transistor of claim 3, wherein said intrinsic base region, said extrinsic base region, and said base link-up region have top surfaces at a position above said top surfaces of said barrier structures.

* * * * *